United States Patent [19]

Sherry

[11] Patent Number: 4,763,829

[45] Date of Patent: Aug. 16, 1988

[54] SOLDERING OF ELECTRONIC COMPONENTS

[75] Inventor: William M. Sherry, Allentown, Pa.

[73] Assignee: American Telephone and Telegraph Company, AT&T Bell Laboratories, Murray Hill, N.J.

[21] Appl. No.: 870,712

[22] Filed: Jun. 4, 1986

[51] Int. Cl.[4] .................................................. B23K 31/02
[52] U.S. Cl. ................................................................ 228/124
[58] Field of Search ...................... 228/37, 39, 57, 124, 228/180.1, 180.2, 118

[56] References Cited

U.S. PATENT DOCUMENTS

| | | | |
|---|---|---|---|
| 3,084,650 | 4/1963 | Johns | 228/180.1 |
| 3,266,136 | 8/1966 | Gulbier | 228/37 |
| 3,599,326 | 8/1971 | DiRenzo | 228/118 |
| 3,647,533 | 3/1972 | Hicks | 117/212 |
| 3,966,110 | 6/1976 | Boynton | 228/175 |
| 4,068,792 | 1/1978 | Dixon | 228/39 |
| 4,254,163 | 3/1981 | Piazza | 228/118 |
| 4,311,267 | 1/1982 | Zim | 228/180.2 |
| 4,371,912 | 2/1983 | Guzik | 228/180.2 |
| 4,373,655 | 2/1983 | McKenzie | 228/39 |
| 4,421,265 | 12/1983 | Boyer et al. | 228/39 |
| 4,560,584 | 12/1985 | Henninger | 228/118 |

OTHER PUBLICATIONS

"Wafer-Chip Assembly for Large-Scale Integration", *IEEE Transactions on Electron Devices*, vol. ED-15, Sept. 1968, pp. 660–663, Kraynak et al.

U.S. Patent Application of Herrero and Schaper, Ser. No. 658,799, filed Oct. 9, 1984.

*Primary Examiner*—M. Jordan
*Attorney, Agent, or Firm*—Lester H. Birnbaum

[57] ABSTRACT

Disclosed is a technique for providing solder bumps to electronic components, such as silicon chips, chip carriers, and circuit boards, so as to achieve large stand-off heights. The component is covered with a mask, such as a photoresist, leaving exposed the solder pads on the component. Solder is applied to the surface along with ultrasonic energy so that the solder wets the exposed pads. The mask acts as a mold for the solder, thereby producing large solder bump heights.

13 Claims, 2 Drawing Sheets

SOLDERING OF ELECTRONIC COMPONENTS

BACKGROUND OF THE INVENTION

The invention relates to fabrication of electronic component assemblies, and in particular to a method of soldering components together.

Fabrication of circuit assemblies typically involves some soldering of components. For example, the interconnection pads of silicon integrated circuit chips can be soldered directly to interconnection substrates or may be mounted in chip carriers which in turn are soldered to the substrates. Recently, it has also been proposed that chips could be soldered to a silicon wafer to provide a new type of wafer scale integration assembly for very large scale integrated circuits. (See, for example, U.S. patent application of Herrero and Schaper, Ser. No. 658,799, filed Oct. 9, 1984 and assigned to the present assignee.)

In the usual case of soldered components to supporting substrates, it is desirable to achieve a large stand-off height (the gap between a component and a supporting substrate) to permit inclusion of conductors or other elements under the component to provide improved reliability and/or easy cleaning. The need for large stand-off heights requires large solder mounds formed between the component and substrate, which mounds must also have a fairly uniform height distribution. For example, a wafer scale integration application could require a maximum deviation of only $\pm 5$ $\mu m$ in solder height for 30 $\mu m$ height solder bumps.

Various methods are available for producing large solder mounds on the component, the most common techniques being vapor deposition and electroplating. Such techniques can routinely achieve bump heights of 125 $\mu m s$. While adequate, such techniques require fairly long processing times and special equipment which could adversely affect the economies of fabricating the assemblies.

It is, therefore, an object of the invention to provide a method of depositing solder mounds to electronic components in an economical fashion.

SUMMARY OF THE INVENTION

This and other objects are achieved in accordance with the invention which is a method of soldering together electronic components having bonding pads formed on a major surface, including depositing solder mounds on at least one of said components. The component is covered with a mask so as to expose the bonding pads. Solder is applied to the component while also applying ultrasonic energy to the solder so that the solder wets the surfaces of the exposed pads. The mask is removed and solder mounds are left on the pads.

BRIEF DESCRIPTION OF THE DRAWING

These and other features are delineated in detail in the description to follow. In the drawing.

It will be appreciated that for purposes of illustrated, these figures are not necessarily drawn to scale.

DETAILED DESCRIPTION

The basic principles of the invention will be described with reference to the sequence of events illustrated in FIGS. 1–4.

Figure 1:
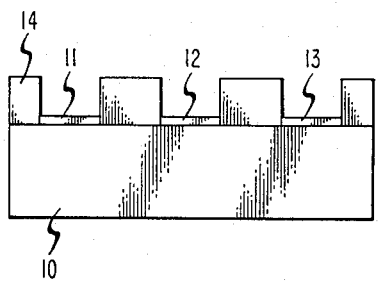
FIGS. 1–4 are side views of an electronic component at various stages of fabrication in accordance with an embodiment of the invention.

FIG. 1 shows a typical silicon chip, 10, with bonding pads 11, 12, and 13, typically formed on the periphery of one major surface (although the pads could be located anywhere on the surface). A typical chip would measure 1 cm $\times$ 1 cm, while the bonding pads usually measure 125 $\mu m \times$ 125 $\mu m$. The pads are formed from a multilayer structure consisting of a 1 $\mu m$ layer of aluminum, a 1 $\mu m$ thick layer of nickel and a 0.2 $\mu m$ layer of gold in this example, but other metals might be employed. It will be appreciated that a typical silicon chip would usually include many more pads, as well as conductors and insulating layers on the surface, but such features are omitted for the sake of simplicity. It will also be appreciated that, although a silicon chip is shown in this example, the invention is also useful for depositing solder on other small components, such as ceramic chip carriers. Solder may also be applied to substrates providing electrical interconnection between small components such as chips and other elements. It should, therefore, be understood that in the context of this application the term "electronic component" includes such interconnecting substrates such as printed wiring boards and thin or thick film circuit substrates.

As also illustrated in FIG. 1, a mask, 14, is formed over the surface of the silicon chip so as to expose the pads 11, 12 and 13 while protecting the remaining portions of the surface. In a preferred embodiment, the mask is a photoresist layer which is deposited and defined by standard techniques. In this example, the photoresist was a commercially available dry film material which is sold by DuPont under the designation Riston 1030. The material was deposited as a uniform layer by standard dry film lamination with a thickness of approximately 75 $\mu m$. The areas of the resist over the pads were exposed and developed by standard photolithography in order to form the mask openings, which expose the surfaces of the pads as illustrated. Other suitable materials for the mask include non-photodefinable and photodefinable dry and wet film polymers. Generally, thicknesses of the mask layer within the range 10–150 $\mu m$ should be useful.

Figure 2:
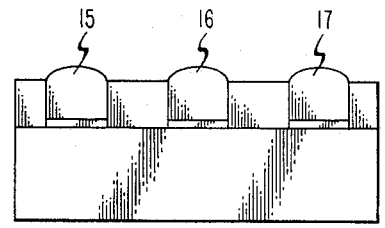

In the next step, as shown in FIG. 2, the chip with the protective mask on the surface was exposed to solder so as to wet the exposed pads and form solder mounds 15, 16, and 17 therein. Due to the small size of the pads, such wetting presents a problem. That is, ordinarily solder will not penetrate the openings in the mask to cover the surface of the pads. However, this problem can be overcome by a solder deposition method illustrated schematically in FIG. 5.

Figure 4:
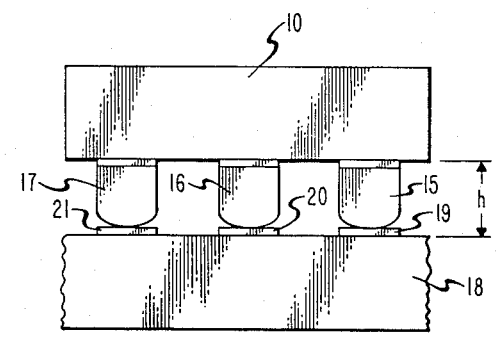
Figure 5:
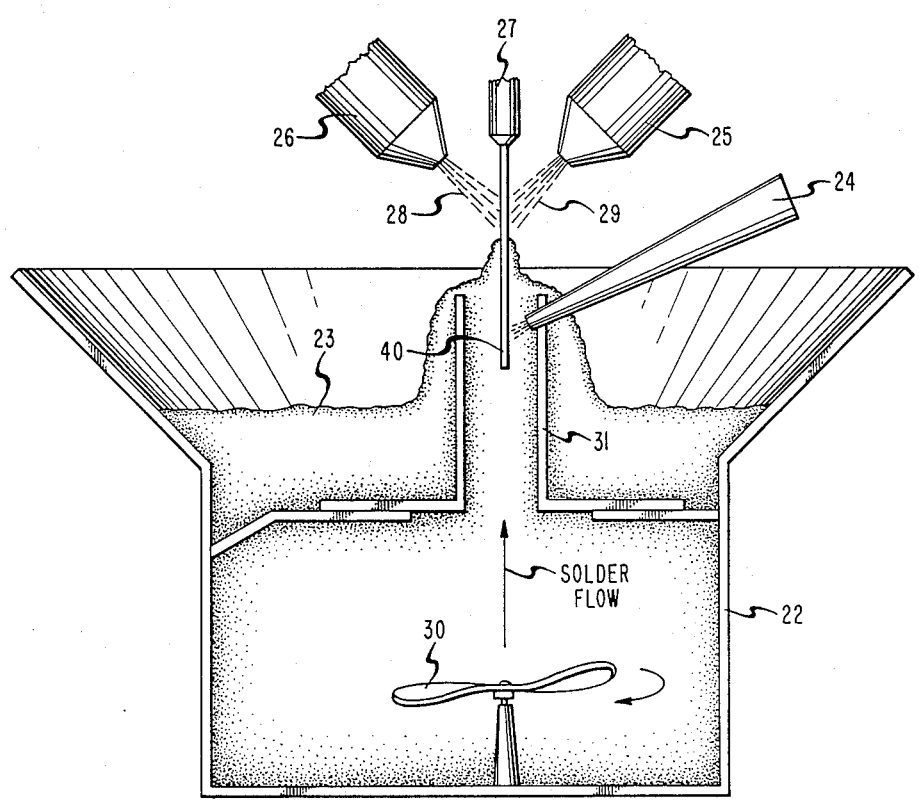
FIG. 5 is a schematic view of apparatus which may be utilized in accordance with the same embodiment.

As shown in FIG. 5, a container 22, includes a bath of molten solder 23. In this example, the solder was 60 weight percent tin and 40 weight percent lead but other standard solders would be used. The solder was heated to a temperature of approximately 230° C. The apparatus included means, such as a propeller 30, driven by a motor (not shown) which causes the solder to be driven upward (in the direction of the arrow) into the area defined by the compartment 31 where a silicon wafer 40, is immersed. (This wafer will ultimately be broken into several chips of the type shown in FIGS. 1–4.) This solder motion is advantageous in breaking down and removing the oxides formed on the surface of the solder, thus helping to eliminate the need for applying a flux to the pads prior to solder deposition. However, it is not believed that this feature is essential.

The wafer, 40, which was held by a jaw, 27, was dipped into the solder for a period of 1–2 seconds. At the same time, ultrasonic energy was applied to the solder by a commercially-available ultrasonic horn illustrated as element 24. (It will be appreciated that ultrasonic soldering apparatus are commercially available. The particular type used here was an ultrasonic soldering unit sold by Bronson Sonic Power Company which was modified with the means for creating the solder fountain. Other types of apparatus should also be useful). The power level of the horn was approximately 150 watts, but levels of 50–300 watts should be advantageous. The ultrasonic energy serves to break down the surface tension of the solder, thus permitting the solder to penetrate the openings in the mask and wet the exposed pads. Ultrasonic energy also aids in breaking up any oxide on the pad surfaces, thus eliminating the need for a fluxing operation. The cavitation caused by the ultrasonic energy, however, can also result in removal of metallization from the pads if exposure is too long. Consequently, it is recommended that the chip be immersed in the solder for a period of less than 5 seconds.

Upon removal of the wafer from the solder bath, as also shown in FIG. 5, the wafer can be hit by jets of hot air 28 and 29, generated by air knives, 25 and 26, situated adjacent to both major surfaces of the chip in accordance with well-known hot air leveling solder techniques. The jets help in the removal of excess solder from the surface of the mask, but are not believed to be necessary for most applications. In this example, jets at a temperature of 250° C. and pressure of 10 psi were utilized.

Whether or not hot air jets are employed, any excess solder on the surface of the mask should be easily removed in most cases by removal of the mask. In this example, the mask was removed by immersion in a solution comprising methylene chloride azeotrope with methanol. However, any material which dissolves the mask while not significantly affecting the solder mounds could be employed. The wafer was immersed in the solution for a period of approximately 10 minutes.

Figure 3:
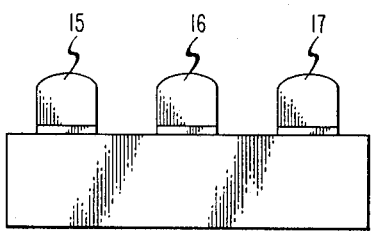

The resulting chip structure is illustrated in FIG. 3. Solder mounds 15, 16 and 17, were left only on the pads 11, 12, 13, previously exposed by the photoresist mask. The solder was essentially molded by the openings in the mask to produce mounds having a fairly large and uniform height. In this example, the means solder bump height (for a total of 100 pads) was approximately 30 microns, with heights varying from 25 to 35 microns. This is considerably more than heights which are ordinarily produced by standard wave soldering or solder dipping methods where the solder height is limited by surface tension effects.

As illustrated in FIG. 4, the chip, 10, can then be soldered to the next level of interconnection, which in this case is a silicon semiconductor wafer, 18, with pads 19, 20 and 21 on the surface. (Again, additional elements on the wafer have been omitted.) The wafer typically measures 4 inches×4 inches×0.020 inches thick, while the pads are composed of a sandwich metallization of Al, Ni, Au (as noted earlier) and measure 125 $\mu$m×125 $\mu$m×1 $\mu$m. The chip is placed so that the solder mounds 15, 16, and 17 contact the pads 19, 20 and 21, of the wafer and the structure is heated to melt the solder and form the bond. In this example, the heating was done at a peak temperature of approximately 240° for approximately 1 minute. A typical wafer scale integrated structure can therefore, be produced with many chips bonded to a single wafer.

The method of the present invention, therefore, produces a significant stand-off height, h, between the surface of the chip and the surface of the wafer (in this example, approximately 33 microns). In general, a standoff height of at least 25 $\mu$m is desirable for wafer scale integration. This is accomplished by a solder deposition process which is effected within a matter of seconds and without the need for a fluxing operation. The present method is also advantageous in that, apparently, the solder can be made to wet non-noble pad metals (e.g., nickel) so that the cost of putting gold layers on the surfaces of the pads may be eliminated. Further, the height of the mounds should be sufficiently uniform for wafer scale integrated structures.

While the invention has been described with reference to bonding chips to wafers to obtain wafer scale integrated structures, it should be apparent that the method may be utilized for bonding together other types of electronic components. For example, the chip shown in FIG. 3 may be bonded to a standard printed circuit board. Further, the chip could be mounted in a ceramic chip carrier which is, in turn, bonded to a substrate, and the solder mounds applied to the carrier in the same manner described above. The chip could also be bonded to thick or thin film circuits. Rather than apply the solder to the chip or chip carrier, the mounds could be formed on the interconnecting substrate utilizing the same techniques.

Thus, the invention is most advantageous whenever it is desired to bond together electronic components to produce a large stand-off height and where the bonding pads are sufficiently small that wetting by the solder would otherwise be difficult. It is, therefore, anticipated that the invention is desirable where stand-off heights are at least 20 $\mu$m and the bonding pads are less than 500×500 $\mu$m, or 250,000 $\mu$m$^2$ in area.

Various additional features will become apparent to those skilled in the art. All such variations which basically rely on the teachings through which the invention has advanced the art are properly considered within the scope of the invention.

What is claimed is:

1. A method of soldering together electronic components having bonding pads having an area less than 250,000 $\mu$m$^2$ formed on a major surface including depositing solder mounds on at least one of said components comprising the steps of:
   covering the one of said components with a mask having a thickness of at least 10 $\mu$m so as to expose the bonding pads;
   applying solder to the component while also applying ultrasonic energy to the solder so that the solder wets the surfaces of the exposed pads; and
   removing the mask while leaving the solder in the form of mounds on the pads.

2. The method according to claim 1 wherein the mask comprises a photoresist material.

3. The method according to claim 1 wherein the said one of the components is a semiconductor chip.

4. The method according to claim 1 wherein the solder is applied by immersing the component in molten solder.

5. The method according to claim 4 wherein the solder is propelled toward the immersed component.

6. The method according to claim 4 wherein the component is immersed for less than 5 sec.

7. The method according to claim 1 wherein the solder mounds are at least 25 μm high.

8. The method according to claim 1 wherein the ultrasonic energy lies within the range 50–300 watts.

9. The method according to claim 1 further comprising the step of bonding the one of said components to the other component so as to produce a stand-off height of at least 25 μm.

10. The method of depositing solder mounds on an electronic component having bonding pads of an area less than 250,000 μm² formed on a major surface comprising the steps of:

covering the components with a photoresist mask having a thickness of at least 10 μm so as to expose the bonding pads and cover the remaining portion of the structure;

immersing the component in molten solder while applying ultrasonic energy to the solder for a period of less than 5 sec so that the solder wets the surfaces of the exposed pads;

removing the photoresist mask while leaving the solder in the form of mounds at least 20 μm high on the pads.

11. The method according to claim 10 wherein the component is a semiconductor chip.

12. The method according to claim 10 wherein the component is a board used for interconnecting semiconductor components.

13. The method according to claim 10 wherein the solder is propelled toward the immersed component.

* * * * *